(12) United States Patent
Cheng et al.

(10) Patent No.: US 7,381,586 B2
(45) Date of Patent: Jun. 3, 2008

(54) METHODS FOR MANUFACTURING THIN FILM TRANSISTORS THAT INCLUDE SELECTIVELY FORMING AN ACTIVE CHANNEL LAYER FROM A SOLUTION

(75) Inventors: Hua-Chi Cheng, Cyonglin Township, Hsinchu County (TW); Cheng-Chung Lee, Jhudong Township, Hsinchu County (TW); Ming-Nan Hsiao, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 419 days.

(21) Appl. No.: 11/154,226

(22) Filed: Jun. 16, 2005

(65) Prior Publication Data

US 2006/0286725 A1    Dec. 21, 2006

(51) Int. Cl.
    *H01L 21/368* (2006.01)
(52) U.S. Cl. .................... 438/104; 438/158; 438/164; 438/497; 257/E21.7
(58) Field of Classification Search ............... 438/159, 438/497, 498; 257/E21.7
    See application file for complete search history.

(56) References Cited

U.S. PATENT DOCUMENTS

| | | | | |
|---|---|---|---|---|
| 5,334,864 A | * | 8/1994 | Tokunaga et al. | ............ 257/78 |
| 5,946,551 A | | 8/1999 | Dimitrakopoulos et al. | .. 438/99 |
| 6,218,206 B1 | * | 4/2001 | Inoue et al. | ............... 438/30 |
| 6,225,149 B1 | | 5/2001 | Gan et al. | .................. 438/151 |
| 6,821,811 B2 | * | 11/2004 | Hirakata et al. | ............ 438/82 |
| 7,115,900 B2 | * | 10/2006 | Aizenberg et al. | .......... 257/40 |
| 7,253,431 B2 | * | 8/2007 | Afzali-Ardakani et al. | ... 257/20 |

FOREIGN PATENT DOCUMENTS

| TW | 251379 | 7/1995 |
|---|---|---|
| TW | 490743 | 6/2002 |
| TW | 546846 | 8/2003 |
| TW | 595002 | 6/2004 |
| TW | 1222225 | 10/2004 |
| TW | 1227565 | 2/2005 |
| TW | 1228832 | 3/2005 |
| TW | 1231046 | 4/2005 |

OTHER PUBLICATIONS

P. F. Carcia et al. / Transparent ZnO thin-film Transistor fabricated by rf magnetron sputtering / Applied Physics Letters / vol. 82, No. 7, pp. 1117-1119 / Feb. 17, 2003.

* cited by examiner

*Primary Examiner*—Stephen W Smoot

(57) ABSTRACT

A method for manufacturing TFTs is provided. It can be applied to both inverted staggered and co-planar TFT structures. The manufacturing method for the staggered TFT includes the formation of a gate electrode, a gate insulator, an active channel layer, a drain electrode, and a source electrode on a substrate. It emphasizes the use of metal oxides or II-VI compound semiconductors and low-temperature CBD process to form the active channel layer. In a CBD process, the active channel layers are selectively deposited on the substrates immersed in the solution through controlling solution temperature and PH value. The invention offers the advantages of low deposition temperature, selective deposition, no practical limit of panel size, and low fabrication cost. Its low deposition temperature allows the use of flexible substrates, such as plastic substrates.

28 Claims, 6 Drawing Sheets

METHODS FOR MANUFACTURING THIN FILM TRANSISTORS THAT INCLUDE SELECTIVELY FORMING AN ACTIVE CHANNEL LAYER FROM A SOLUTION

FIELD OF THE INVENTION

The present invention relates to thin-film transistors (TFTs), and more specifically to a method for manufacturing TFTs.

BACKGROUND OF THE INVENTION

Flat panel electronic displays have become more and more popular in many electronic media because of their flexibility, lightweight, and mechanically robust property. Such potential for flat panel electronic displays and other devices on plastic substrates has motivated considerable research on new materials and improved processes for fabricating TFTs.

The requirements and applications to the active devices for TFTs are getting more. Low-temperature film formation, less-selectivity on substrate, and direct patterning are the basic requirements in the fabricating process for the applications of TFTs. In addition, it requires the active devices to be suitable for the applications of both glass substrate and plastic substrate, in order to achieve the advantages of low fabrication cost and getting a large display area.

A recent attempt to fabcriate a TFT by a solution method has the advantages of easy and accurate control on material components, low-temperature fabricating process, high quality on the film, and low fabrication cost.

In general, TFTs can be catagorized into two types of structure, inverted staggered and co-planar. As shown in FIG. 1, the co-planar TFT structure has a gate electrode 101 formed on the top of an active channel layer 102. On the contrary, the inverted staggered TFT structure has an active channel layer 202 formed on the top of a gate electrode 201, as shown in FIG. 2. These TFTs are usually formed from a thin film of amorphous silicon (a-Si) or polycrystalline silicon (poly-Si). The a-Si and poly-Si thin films are typically deposited by sputtering or chemical vapor deposition (CVD) and low-pressure chemical vapor deposition (LPCVD), respectively. The deposition temperature of either CVD or LPCVD is relatively high (around 350° C. for CVD and 500° C.-650° C. for LPCVD). This not only requires high-energy consumption but also limits the choices of panel substrates and panel sizes. Therefore, a low processing temperature for fabricating TFTs is highly desired.

In order to meet the requirements of low-temperature processing, deposition of TFTs using chemical solutions was proposed. In 1997, organic semiconductors were adopted by Dimitrakopoulos et al in U.S. Pat. No. 5,946,551 to fabricate active channels of TFTs. The drawback of the organic TFTs is that their performance (e.g., carrier mobility and ratio of on-current and off-current $I_{on}/I_{off}$) is much inferior to their a-Si counterparts.

TFTs deposited by chemical solution method using CdS or CdSe as an active semiconductor was disclosed by Gan et al in U.S. Pat. No. 6,225,149 in 1999. The active layer of the TFTs was first deposited by a chemical bath deposition (CBD) method. Then, the active semiconductor layer was patterned using lithography and etching process. The method for fabricating a TFT requires an annealing step at 400° C. In addition, the toxic materials involved in the fabrication process are one of the major concerns of their applications.

In order to meet the low processing temperature requirements of flexible substrates (e.g., plastic substrates) and to maintain a performance equivalent to their a-Si counterpart, ZnO TFTs fabricated by rf magnetron sputtering was proposed by Carcia et al in 2003 (Appl. Phys. Lett., Vol. 82, No. 7, 1117). Although low-temperature solution deposition of ZnO has gradually received attention in the research community, the applications of the deposition method to TFT fabrication have not been applied yet. It is still in the research state on the characteristics of semiconductors.

Based on both low-temperature requirements and environmental concerns, future development trend is believed to focus on metal oxides and high dielectric constant materials. The materials used for thin-film devices fabrication will play an important role and guide the direction of technology development.

SUMMARY OF THE INVENTION

The present invention has been made to overcome the drawbacks of conventional Si-based TFTs. The primary objective of the present invention is to provide a method for manufacturing TFTs. The manufacturing method of the present invention comprises the formation of a gate electrode, a gate insulator, an active channel, a drain electrode, and a source electrode on a substrate. It can be applied to both inverted staggered and co-planar TFT structures. The manufacturing method for inverted staggered and co-planar TFT structures are respectively described in two preferred embodiments.

According to the present invention, it emphasizes the use of metal oxides or II-VI compound semiconductors and low-temperature CBD to form the active channel layer. In a CBD process, the active channel layers are selectively deposited on the substrates immersed in the solution through controlling solution temperature and PH value. The properties of the deposited film can be properly adjusted by varying the composition and/or elements of the film. Patterning of the active channel layer is obtained through selective deposition by the CBD method.

The deposition temperature of the present invention is as low as 20° C.-90° C. Its low deposition temperature allows the use of flexible substrates, such as plastic substrates. It also offers the advantages of no practical limit of panel size, low fabrication cost and safe environment. Furthermore, the fabrication cost is significantly reduced if multiple panels are processed simultaneously The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 1:
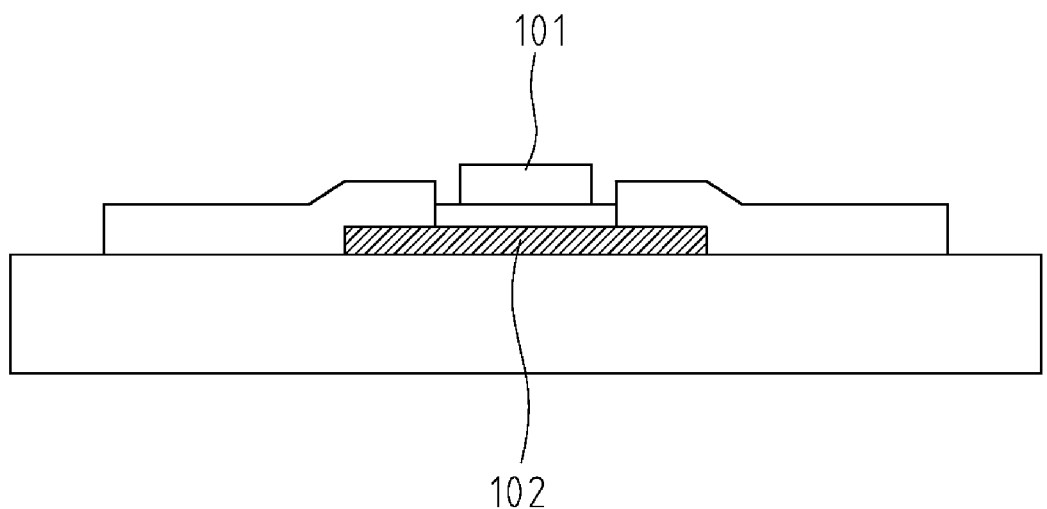
FIG. 1 shows a conventional inverted staggered TFT structure.
Figure 2:
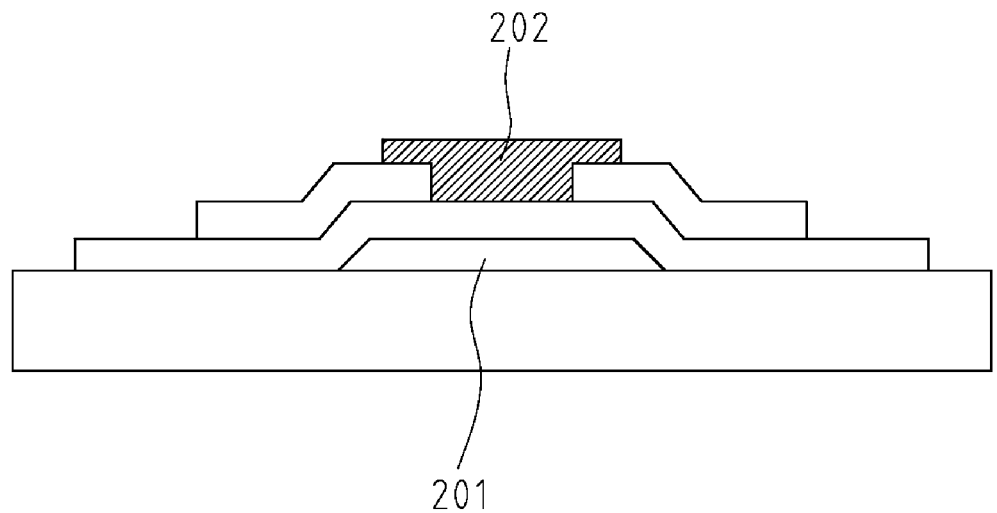
FIG. 2 shows a conventional co-planar TFT structure.
Figure 3A:
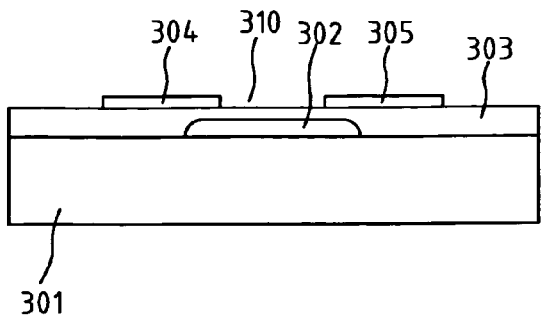
FIG. 3A is a schematic cross-sectional view of an inverted staggered TFT having a gate electrode, an insulator, an active channel, a drain electrode, and a source electrode on a substrate.

In a first embodiment of the present invention, an inverted staggered TFT is fabricated. The manufacturing method for the staggered TFT includes the formation of a gate electrode, a gate insulator, an active channel layer, a drain electrode, and a source electrode on a substrate. FIGS. 3A-3D illustrate the manufacturing flow of an inverted staggered TFT according to the present invention. FIG. 3A is a schematic cross-sectional view of the inverted staggered TFT having a gate electrode, an insulator, an active channel, a drain electrode, and a source electrode on a substrate. Referring to FIG. 3A, it comprises the following fabrication steps. (a1) depositing a first conducting layer and patterning the first conducting layer to form a gate electrode 302 on a substrate 301. (a2) depositing and patterning a high-dielectric-constant insulating layer 303 on the gate electrode 302 and part of the substrate 301, (a3) depositing a second conducting layer and patterning the second conducting layer to form a source electrode 304, a drain electrode 305, connecting circuits (not shown), and an open channel 310 between the source electrode 304 and the drain electrode 305. In other words, an active channel region is defined above the gate electrode 302 and between the source electrode 304 and the drain electrode 305.

Figure 3B:
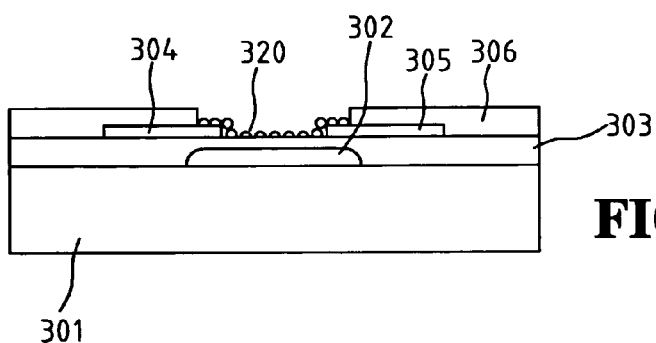
FIG. 3B is a schematic cross-sectional view after a surface treatment of the fabricated TFT shown in FIG. 3A.

FIG. 3B is a schematic cross-sectional view after a surface treatment of the fabricated TFT shown in FIG. 3A. Referring to FIG. 3B, it comprises the following fabrication steps. (b1) depositing and patterning a photo resist layer 306 to form an open area 320 on top of the open channel, and doing a surface treatment to enhance the adhesion of subsequent layer onto the open area. The surface treatment can be a plasma etching or a chemical reaction method to embed nanostructure catalyst onto the open surface.

Figure 3C:
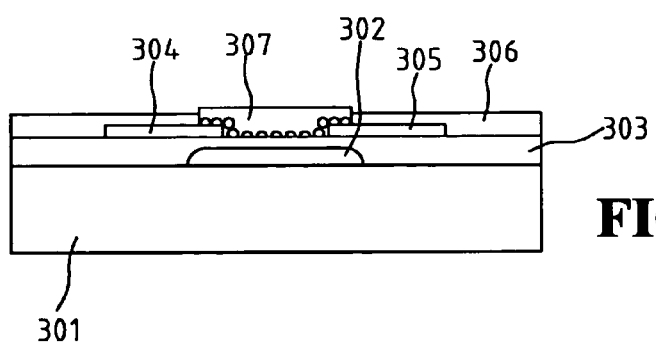
FIG. 3C is a schematic cross-sectional view after growing a CBD film of the fabricated TFT shown in FIG. 3B.
Figure 3D:
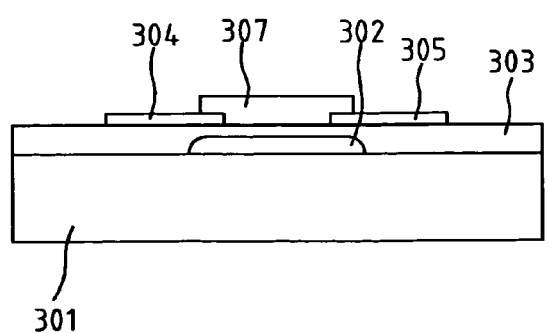
FIG. 3D is a schematic cross-sectional view of the inverted staggered TFT according to a first embodiment of the present invention.

FIG. 3C is a schematic cross-sectional view after growing a CBD film of the fabricated TFT shown in FIG. 3B. Referring to FIG. 3C, it comprises the following fabrication step. (c1) selectively forming an active channel layer 307 on the open area of the photo resist 306 using a low-temperature solution method, wherein the active channel layer overlaps said source electrode and said drain electrode. Finally, the present invention strips the photo resist layer and deans the active channel layer 307, as shown in FIG. 3D.

Figure 4A:
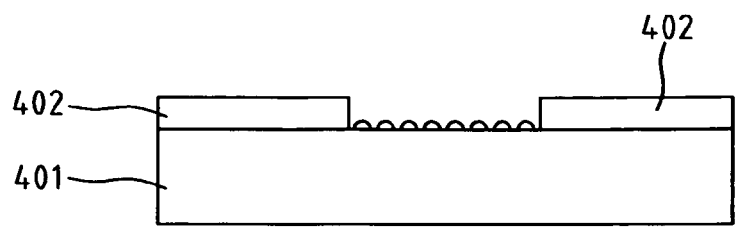
FIG. 4A is a schematic cross-sectional view of a co-planar TFT after photo resist patterning and surface treatment.

In a second embodiment of the present invention, a co-planar TFT is fabricated. FIGS. 4A-4D illustrate the manufacturing flow of the co-planar TFT. The manufacturing method includes photo resist patterning, surface treatment, CBD film growth, photo resist stripping, depositing and patterning an insulator, and formation of drain electrode, source electrode, and gate electrode. FIG. 4A is a schematic cross-sectional view of the co-planar TFT after photo resist patterning and surface treatment. Referring to FIG. 4A, it includes the following fabrication steps. (a1) depositing and patterning a photo resist 402 to expose an active channel on a substrate 401. (a2) doing a surface treatment to enhance the adhesion of subsequent active channel layer onto the exposed active channel. The surface treatment can be a plasma etching or a chemical reaction method to embed nanostructure catalyst onto the exposed surface.

Figure 4B:
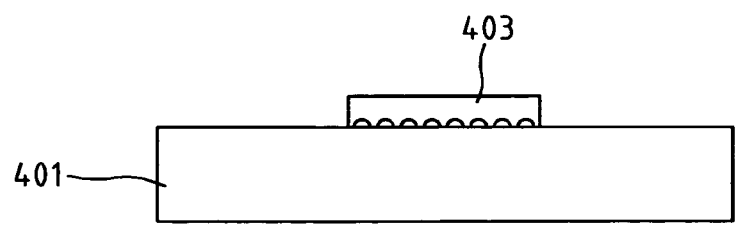
FIG. 4B is a schematic cross-sectional view after forming an active channel layer of the fabricated TFT shown in FIG. 4A.

FIG. 4B is a schematic cross-sectional view after forming an active channel layer of the fabricated TFT shown in FIG. 4A. Referring to FIG. 4B, it includes a fabrication step of selectively forming an active channel layer 403 on the exposed active channel of the photoresist 402 using a low-temperature solution method.

Figure 4C:
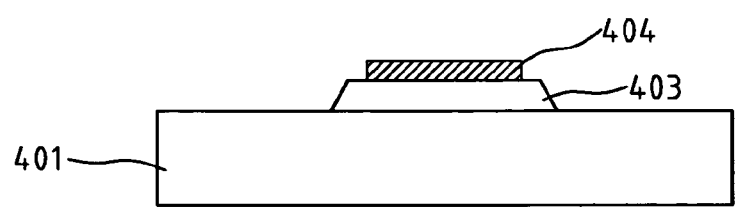
FIG. 4C is a schematic cross-sectional view after forming an insulating layer of the fabricated co-planar TFT shown in FIG. 4B.

FIG. 4C is a schematic cross-sectional view after forming an insulating layer of the fabricated co-planar TFT shown in FIG. 4B. Referring to FIG. 4B, it includes a fabrication step of depositing and patterning a high-dielectric-constant insulating layer 404 to cover the active channel 403.

Figure 4D:
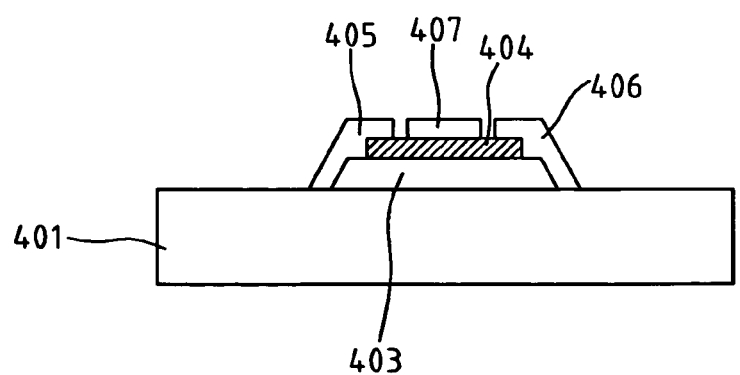
FIG. 4D is a schematic cross-sectional view of the fabricated co-planar TFT according to a second embodiment of the present invention.

FIG. 4D is a schematic cross-sectional view after forming source electrode, drain electrode, and gate electrode of the fabricated TFT shown in FIG. 4C. FIG. 4D is also a complete schematic cross-sectional view of the fabricated co-planar TFT according to a second embodiment of the present invention. Referring to FIG. 4D, it includes the following fabrication steps. (d1) depositing and patterning a conducting layer by photolithographic technique to form a source electrode 405, a drain electrode 406, a gate electrode 407, and connecting circuits (not shown), wherein the source electrode 405 and the drain electrode 406 overlap the active channel layer. (d2) stripping the photo resist layer and cleaning the active channel layer.

Figure 5:
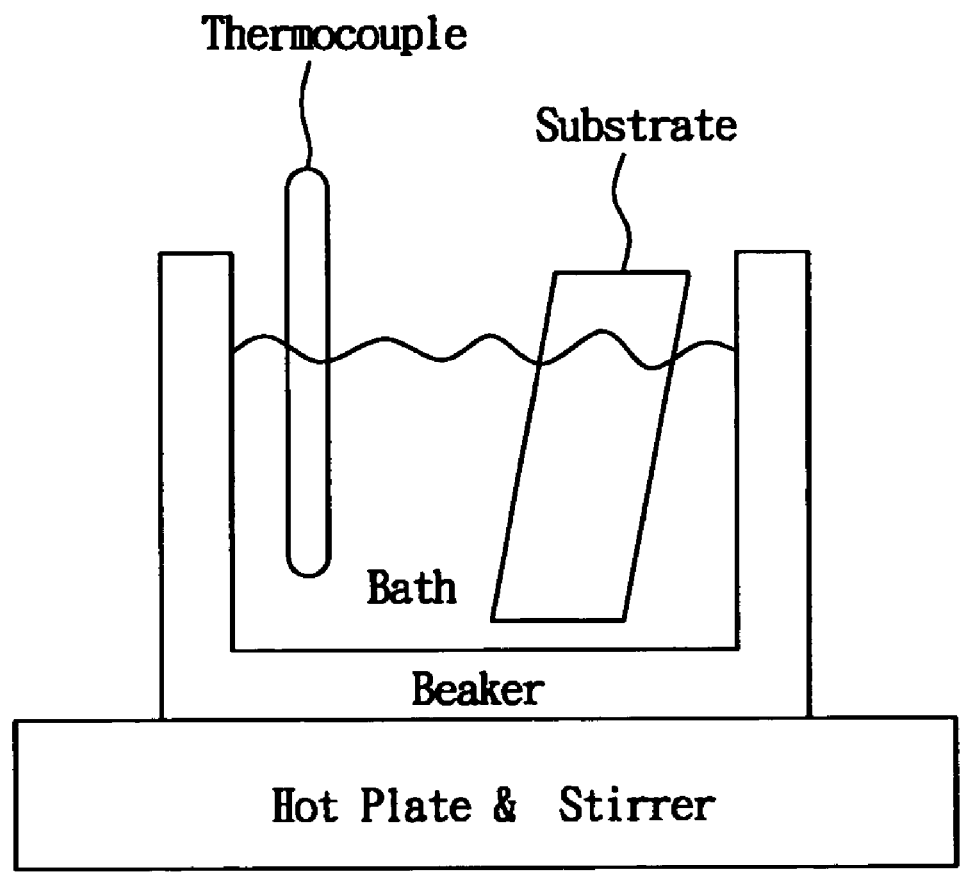
FIG. 5 shows a device for a CBD process.

According to the present invention, the low-temperature solution method for forming the active channel layer is a CBD method. In a CBD process, the active channel layers are selectively deposited on the substrates immersed in the solution through controlling solution temperature and PH value. FIG. 5 shows a device for the CBD process for depositing ZnO film contains a mixture of $Zn(NO_3)_2$ with a mole concentration of 0.01-0.2M and dimethylamineborane with a mole concentation ob 0.01-0.1M. After the CBD process, a DI (deionized) water cleaning for about 1 minute and a blowing dry with nitrogen gas are followed prior to a 105° C. bake on a hot plate for 5 minutes. Inkjet printing or micro-contact or spin coating can be used to fabricate other conducting layers, such as gate electrode, source electrode, drain electrode, and connecting circuits.

The fabrication methods of other conducting layers (such as gate electrode, source electrode, drain electrode, and connecting circuits) include, but not limited to, electroplating, electrodeless deposition, electrodeposition, sputtering deposition, inkjet printing, micro-contact, and spin coating. The materials of these conducting layers can be chosen from the group of Ag, Cu, Au, Mo, Cr, Al, W, Ni, Pt, and any conducting films with an electrical resistance smaller than $10^{-6}$ $\Omega$-cm. The formation process of the insulating layer (gate insulator) can be chosen from the group of anodisation process, plasma enhanced chemical vapor deposition, RF magnetron sputtering, e-gun deposition, inkjet printing, micro-contact, and spin coating. The material of the insulating layer can be organic or inorganic. The organic materials include polyimide and polyacrylate. The non-organic material can be $SiO_2$ or $SiN_x$ or $Al_2O_3$ or $Ta_2O_5$. The substrate material can be a silicon wafer or a glass substrate or even a flexible substrate due to the low processing temperatures adopted by the present invention.

The manufacturing method according to the present invention emphasizes the use of metal oxides or II-VI compound semiconductors and low-temperature CBD process to form the active channel layer. The metal oxides include, but not limited to, ZnO, $SnO_2$, and $TiO_2$. Compound semiconductors formed by column II and column VI elements in the periodic table or other special elements can serve the same. These column II and column VI elements or other special elements include, but not limited to, S, B, Mg, Sn, and Al. The properties of the deposited film can be properly adjusted by varying the composition and/or elements of the film.

Figure 6:
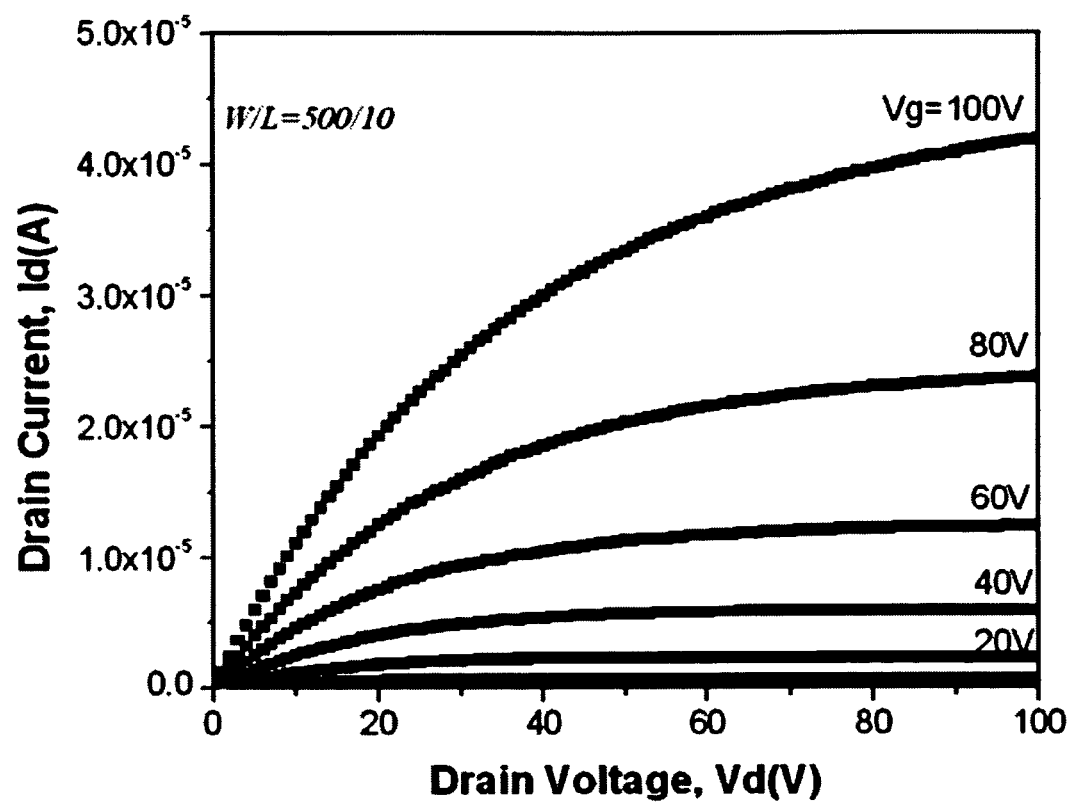
FIG. 6 shows the drain current vs. drain voltage characteristics of a ZnO TFT according to the present invention.

Good quality TFTs have been fabricated and tested using the processes described in the embodiments of the present invention. Experimental results for a typical TFT with chemical bath deposited ZnO active channel layer is shown in FIG. 6, where the drain current is plotted versus the drain voltage for five gate voltages. The saturation behavior and the reasonable driving capability of the transistor are evident.

In summary, the present invention provides a method for manufacturing thin film transistors. The TFTs may have inverted staggered or co-planar structures. Wherein, the active channel layer in either an inverted staggered or co-planar TFT is formed by using a low-temperature CBD method. The fabricating TFT process includes definition of active channel region, growth of active channel layer, and cleaning.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for manufacturing thin film transistors (TFTs), comprising the steps of:
    depositing a first conducting layer and patterning said first conducting layer to form a gate electrode on a substrate;
    depositing and patterning a high-dielectric-constant insulating layer on said gate electrode and part of said substrate;
    depositing a second conducting layer and patterning said second conducting layer to form a source electrode, a drain electrode, connecting circuits, and an open channel between said source electrode and said drain electrode;
    depositing and patterning a photo resist layer to form an open area on top of said open channel, and doing a surface treatment to enhance the adhesion of subsequent layer onto said open area;
    selectively forming an active channel layer on said open area of said photo resist using a low-temperature solution method, wherein said active channel layer overlaps said source electrode and said drain electrode; and
    stripping said photo resist layer and cleaning.

2. The method for manufacturing TFTs as claimed in claim 1, wherein said low-temperature solution method is a chemical bath deposition (CBD) process, and said CBD process is controlled by solution temperature and PH value.

3. The method for manufacturing TFTs as claimed in claim 2, wherein said solution temperature is between 20° C. and 90° C., and said PH value is between 6 and 12.

4. The method for manufacturing TFTs as claimed in claim 1, wherein the material of said active channel layer is chosen from the group of metal oxides and compound semiconductors.

5. The method for manufacturing TFTs as claimed in claim 4, wherein said metal oxide is chosen from the group of ZnO, $SnO_2$, and $TiO_2$.

6. The method for manufacturing TFTs as claimed in claim 4, wherein said compound semiconductors are II-VI compound semiconductors.

7. The method for manufacturing TFTs as claimed in claim 4, wherein one component of said compound semiconductor is chosen from the group of S, B, Mg, Sn, and Al.

8. The method for manufacturing TFTs as claimed in claim 1, wherein said substrate is a silicon wafer or a glass substrate or a flexible substrate.

9. The method for manufacturing TFTs as claimed in claim 1, wherein the materials of said first conducting layer and said second conducting layer are chosen from the group of Ag, Cu, Au, Mo, Cr, Al, W, Ni, and Pt.

10. The method for manufacturing TFTs as claimed in claim 1, wherein said first conducting layer and said second conducting layer have an electrical resistance smaller than $10^{-6}$ Ω-cm.

11. The method for manufacturing TFTs as claimed in claim 1, wherein the fabrication methods of said first conducting layer and said second conducting layer are chosen from the group of electroplating, electrodeless deposition, electrodeposition, sputtering deposition, inkjet printing, micro-contact, and spin coating.

12. The method for manufacturing TFTs as claimed in claim 1, wherein the formation process of said insulating layer is chosen from the group of anodisation process, plasma enhanced chemical vapor deposition, RF magnetron sputtering, e-gun deposition, inkjet printing, micro-contact, and spin coating.

13. The method for manufacturing TFTs as claimed in claim 1, wherein the material of said insulating layer is chosen from the group of polyimide, polyacrylate, $SiO_2$, $SiN_x$, $Al_2O_3$, and $Ta_2O_5$.

14. The method for manufacturing TFTs as claimed in claim 1, wherein said surface treatment is chosen from the group of plasma etching and chemical reaction methods.

15. A method for manufacturing thin film transistors (TFTs), comprising the steps of:
    depositing and patterning a photo resist to expose an active channel, and doing a surface treatment to enhance the adhesion of subsequent active channel layer onto said exposed active channel;
    selectively forming an active channel layer on said exposed active channel of said photo resist using a low-temperature solution method;
    depositing and patterning a high-dielectric-constant insulating layer to cover said active channel;
    depositing a conducting layer and patterning said conducting layer by photolithographic technique to form a source electrode, a drain electrode, a gate electrode, and connecting circuits, wherein said source electrode and said drain electrode overlap said active channel layer; and
    stripping said photo resist layer and cleaning.

16. The method for manufacturing TFTs as claimed in claim 15, wherein said low-temperature solution method is a chemical bath deposition (CBD) process, and said CBD process is controlled by solution temperature and PH value.

17. The method for manufacturing TFTs as claimed in claim 16, wherein said solution temperature is between 20° C. and 90° C., and said PH value is between 6 and 12.

18. The method for manufacturing TFTs as claimed in claim 15, wherein the material of said active channel layer is chosen from the group of metal oxides and compound semiconductors.

19. The method for manufacturing TFTs as claimed in claim 18, wherein said metal oxide is chosen from the group of ZnO, $SnO_2$, and $TiO_2$.

20. The method for manufacturing TFTs as claimed in claim 18, wherein said compound semiconductors are II-VI compound semiconductors.

21. The method for manufacturing TFTs as claimed in claim 18, wherein one component of said compound semiconductor is chosen from the group of S, B, Mg, Sn, and Al.

22. The method for manufacturing TFTs as claimed in claim 15, wherein said substrate is a silicon wafer or a glass substrate or a flexible substrate.

23. The method for manufacturing TFTs as claimed in claim 15, wherein the material of said conducting layer is chosen from the group of Ag, Cu, Au, Mo, Cr, Al, W, Ni, and Pt.

24. The method for manufacturing TFTs as claimed in claim 15, wherein said conducting layer has an electrical resistance smaller than $10^{-6}$ $\Omega$-cm.

25. The method for manufacturing TFTs as claimed in claim 15, wherein the fabrication method of said conducting layer is chosen from the group of electroplating, electrodeless deposition, electrodeposition, sputtering deposition, inkjet printing, micro-contact, and spin coating.

26. The method for manufacturing TFTs as claimed in claim 15, wherein the formation process of said insulating layer is chosen from the group of anodisation process, plasma enhanced chemical vapor deposition, RF magnetron sputtering, e-gun deposition, inkjet printing, micro-contact, and spin coating.

27. The method for manufacturing TFTs as claimed in claim 15, wherein the material of said insulating layer is chosen from the group of polyimide, polyacrylate, $SiO_2$, $SiN_x$, $Al_2O_3$, and $Ta_2O_5$.

28. The method for manufacturing TFTs as claimed in claim 15, wherein said surface treatment is chosen from the group of plasma etching and chemical reaction method.

* * * * *